United States Patent
Girdhar et al.

(10) Patent No.: US 9,536,952 B2
(45) Date of Patent: Jan. 3, 2017

(54) BODY CONTACT LAYOUTS FOR SEMICONDUCTOR STRUCTURES

(71) Applicant: INTERSIL AMERICAS LLC, Milpitas, CA (US)

(72) Inventors: Dev Alok Girdhar, Indialantic, FL (US); Jeffrey Michael Johnston, Indian Harbour Beach, FL (US)

(73) Assignee: Intersil Americas LLC, Milpitas, CA (US)

( * ) Notice: Subject to any disclaimer, the term of this patent is extended or adjusted under 35 U.S.C. 154(b) by 0 days.

(21) Appl. No.: 14/590,645

(22) Filed: Jan. 6, 2015

(65) Prior Publication Data

US 2015/0325652 A1    Nov. 12, 2015

Related U.S. Application Data

(60) Provisional application No. 62/007,080, filed on Jun. 3, 2014, provisional application No. 61/992,115, filed on May 12, 2014.

(51) Int. Cl.

| | | |
|---|---|---|
| *H01L 29/76* | (2006.01) | |
| *H01L 29/10* | (2006.01) | |
| *H01L 27/088* | (2006.01) | |
| *H01L 23/535* | (2006.01) | |
| *H01L 29/66* | (2006.01) | |
| *H01L 29/78* | (2006.01) | |
| *H01L 29/06* | (2006.01) | |
| *H01L 29/08* | (2006.01) | |

(52) U.S. Cl.
CPC ......... *H01L 29/1087* (2013.01); *H01L 23/535* (2013.01); *H01L 27/088* (2013.01); *H01L 29/0692* (2013.01); *H01L 29/0847* (2013.01); *H01L 29/1095* (2013.01); *H01L 29/66568* (2013.01); *H01L 29/78* (2013.01)

(58) Field of Classification Search
CPC ........... H01L 21/7681; H01L 21/76829; H01L 21/823475; H01L 21/76897; H01L 21/823425; H01L 21/76895; H01L 29/1095; H01L 27/088; H01L 23/535; H01L 29/66568
USPC ....................................................... 257/368
See application file for complete search history.

(56) References Cited

U.S. PATENT DOCUMENTS

| | | |
|---|---|---|
| 5,773,171 A | 6/1998 | Lee et al. |
| 6,084,266 A | 7/2000 | Jan |
| 6,576,956 B2 * | 6/2003 | Kawanaka ............. H01L 21/84 257/347 |
| 6,680,150 B2 | 1/2004 | Blatchford, Jr. et al. |
| 7,132,717 B2 | 11/2006 | Su et al. |
| 7,960,797 B2 | 6/2011 | Lee et al. |
| 7,981,803 B2 | 7/2011 | Jung |

(Continued)

*Primary Examiner* — Dung Le
(74) *Attorney, Agent, or Firm* — Fogg & Powers LLC

(57) ABSTRACT

Body contact layouts for semiconductor structures are disclosed. In at least one exemplary embodiment, a semiconductor structure comprises: a plurality of gates disposed on a semiconductor layer, each gate extending parallel to a y-axis in a coordinate space; a source region disposed between two of the plurality of gates; a plurality of body contacts disposed in each source region; and wherein a portion of each source region, adjacent to the gate, has a width extending parallel to the y-axis that is greater than the width of the source region parallel to the y-axis at a distance on an x-axis from the gate.

7 Claims, 5 Drawing Sheets

(56) References Cited

U.S. PATENT DOCUMENTS

| | | |
|---|---|---|
| 8,034,544 B2 | 10/2011 | Yune |
| 8,541,316 B2 | 9/2013 | Sukekawa |
| 8,710,484 B2 | 4/2014 | Wei et al. |
| 8,723,297 B2 | 5/2014 | Son et al. |
| 2002/0071293 A1* | 6/2002 | Eden .................. H01L 23/4824 363/20 |
| 2002/0088976 A1* | 7/2002 | Shin ................. H01L 27/11521 257/68 |
| 2005/0266634 A1* | 12/2005 | Park ................... H01L 27/0629 438/238 |
| 2010/0224936 A1* | 9/2010 | Hokazono ........... H01L 21/7681 257/368 |

* cited by examiner

BODY CONTACT LAYOUTS FOR SEMICONDUCTOR STRUCTURES

CROSS-REFERENCE TO RELATED APPLICATIONS

This application claims priority to U.S. Provisional Patent Application Ser. No. 61/992,115 filed on May 12, 2014 and U.S. Provisional Patent Application Ser. No. 62/007,080 filed on Jun. 3, 2014, which are incorporated herein by reference.

DRAWINGS

Understanding that the drawings depict only exemplary embodiments and are not therefore to be considered limiting in scope, the exemplary embodiments will be described with additional specificity and detail through the use of the accompanying drawings, in which.

Figure 1:
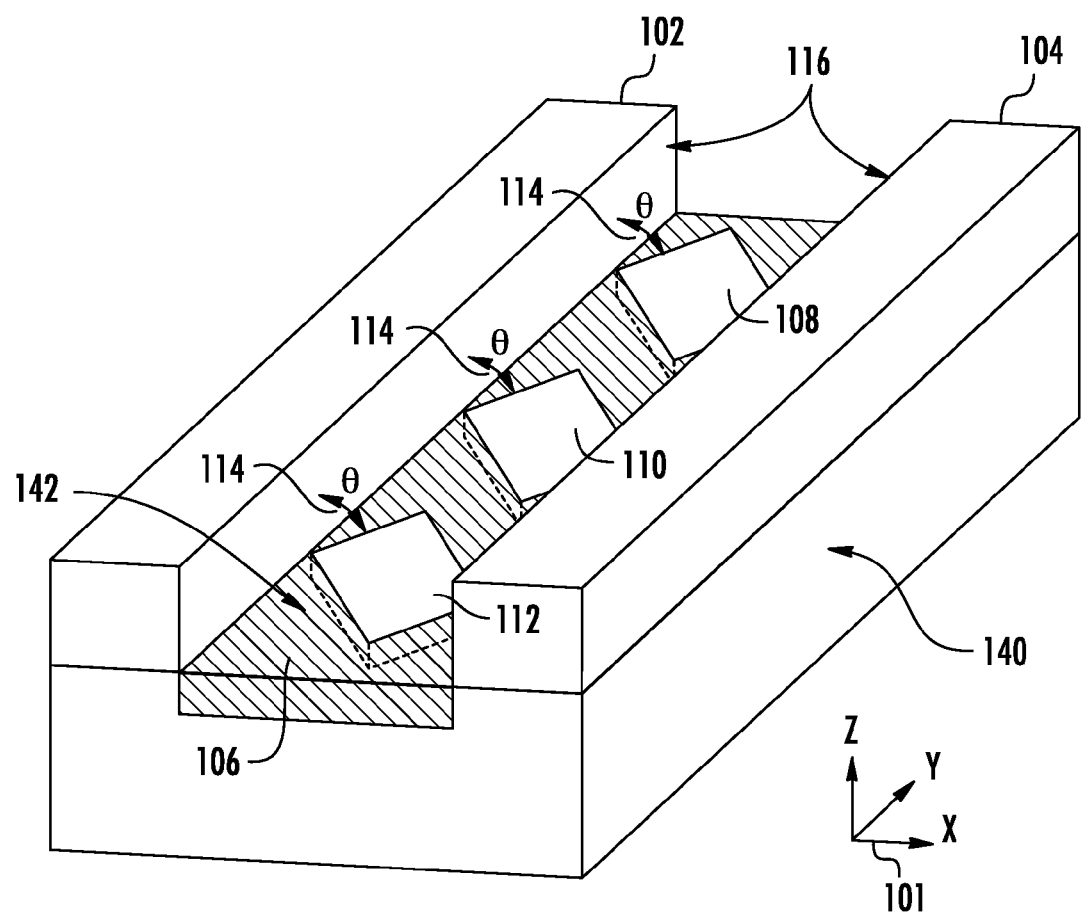
FIG. 1 is a diagram of a perspective view of an exemplary embodiment of an improved body contact layout for enhanced performance of semiconductor structures.

In accordance with common practice, the various described features are not drawn to scale but are drawn to emphasize specific features relevant to the exemplary embodiments.

DETAILED DESCRIPTION

Embodiments of the present disclosure provide a novel body contact layout for a semiconductor structure. For example, the semiconductor structure can be included in a metal-oxide semiconductor field-effect transistor (MOSFET) formed in a semiconductor circuit, wafer, chip or die. The MOSFET can be, for example, an n-channel MOS (NMOS), p-channel MOS (PMOS), complementary MOS (CMOS), or double-diffused MOS (DMOS) transistor. In some embodiments, for example, such a MOSFET can be formed utilizing a silicon-on-insulator (SOI) fabrication technology. In other embodiments, such a MOSFET can be formed for a silicided body contact (or alternatively, on a non-silicide body contact). As such, for example, the semiconductor structure can be a MOSFET utilized in a power supply or power management circuit. Such power management circuits can be utilized, for example, as power supply components in such products as smart phones or similar other products.

In one or more exemplary embodiments, a body contact layout is provided for a semiconductor structure. Specifically, a plurality of body contacts are formed in the source region, wherein the source region is disposed between two gates of a plurality of gates. In some exemplary embodiments, the gates are disposed on a semiconductor layer and each gate extends parallel to a y-axis in a coordinate space, as shown in the Figures. However, in some exemplary embodiments, the gates are disposed in a semiconductor layer and each gate extends parallel to a y-axis in a coordinate space. Moreover, In exemplary embodiments, the source region is disposed in the semiconductor structure. In exemplary embodiments, a portion of each source region, adjacent to the gate, has a width extending parallel to the y-axis that is greater than the width of the source region parallel to the y-axis at a distance on an x-axis from the gate.

In exemplary embodiments, each body contact of the plurality of body contacts has sides that form the shape of a polygon or a modified polygon. In some embodiments, a modified polygon is a circle. For purposes of this disclosure, a modified polygon is a polygon that includes one or more modified (e.g., rounded or chamfered) corners and/or sides. In various embodiments, a side of a body contact can overlap the two gates (as shown in FIGS. 2, 6, 7, 9, and 11), touch the two gates (as shown in FIGS. 1, 3, 4, 8, and 10) or include a space between the two gates (as shown in FIG. 5). Furthermore a body contact does not have to be centered between the two gates.

In exemplary embodiments, a side of each body contact is "canted" from a side of a gate of the plurality of gates. A body contact is "canted" if a side of the body contact's polygon or modified polygon is oriented with an angular deviation θ from a side of one or both of the gates. In some exemplary embodiments, each body contact is "canted" at an angle between 5 degrees and 85 degrees. Furthermore, when a body contact is "canted", the width of the body contact extending parallel to a y-axis in a coordinate system decreases as the body contact approaches a gate of the plurality of gates from approximately the center of the body contact.

As a result of the body contacts being "canted", a substantially smaller width of the source region of the semiconductor structure adjacent to the gates is displaced than the width displaced by conventional body contacts. That is, the source width, adjacent to the gate and extending parallel to a y-axis is larger using the embodiments in this disclosure than in the prior art case using body contacts such as squares with one or more of their sides abutting the side of a gate and thus defining a uniform width across the source region. Also, in contrast to conventional body contacts, the "canted" body contacts do not significantly reduce the width of the source region in the semiconductor structure involved while keeping the spacing between alternate gate lines small. Consequently, the on-state resistance (Ronsp) of a MOSFET that incorporates the semiconductor structure with "canted" body contacts disclosed herein is significantly improved over the Ronsp of a MOSFET with conventional body contacts. For example, the Ronsp of MOSFETs with "canted" body contacts can be as much as 30% lower for 0.13 μm technology semiconductor devices and even lower for smaller features size technology devices. This improvement in the Ronsp of MOSFETs with "canted" body contacts over the Ronsp of MOSFETs with conventional body contacts exists primarily because unlike convention MOSFETs, the source width in the MOSFET with "canted" body contacts is not significantly reduced, even though the source opening in a MOSFET caused by a "canted" body contact can be virtually identical to the source opening caused by a conventional body contact. Consequently, the effective channel width of a MOSFET with "canted" body contacts is significantly greater than the effective channel width of a MOSFET with similarly-sized, conventional body contacts.

Notably, a similar process and equipment utilized to fabricate conventional semiconductor structures (e.g., MOSFETs) can also be utilized to fabricate semiconductor structures with "canted" body contacts. Also, such "canted" body contacts can be utilized in any MOSFET with integrated body contacts, or in any MOSFET that includes integrated body ties. However, the utilization of such "canted" body contacts will likely have the greatest effect on, for example, low voltage MOSFETs in which the source opening comprises a significant portion of the MOSFETs' pitch (e.g., distance between gates).

Summarily, the present disclosure utilizes the minimum size body contacts and spatial distances therebetween to minimize the distance between the gates along the x-axis of the coordinate system, which minimizes pitch and maximizes the width of the source region in the y-axis near the gates of the semiconductor structure involved. Thus, the present disclosure enables minimum size body contacts to be formed in a semiconductor structure (e.g., MOSFET) without relinquishing pitch or sacrificing any of the source region involved.

In other exemplary embodiments, the body contacts can have different shapes. For example, a plurality of body contacts can be formed in a MOSFET, and one or more of the body contacts can have the shape of a polygon, rectangle, parallelogram, trapezoid, pentagon, hexagon, octagon, star, circle, or quadrilateral with or without modified (e.g., rounded or chamfered) corners and/or sides. In some embodiments, the shapes of the body contacts can be formed or modified utilizing, for example, an Optical Proximity Correction (OPC) serif during a fabrication (e.g., photolithography) process.

FIG. 1 depicts a perspective view of a semiconductor structure 100 for enhanced performance, in accordance with one exemplary embodiment of the present disclosure. For example, in one embodiment, semiconductor structure 100 can be included in a MOSFET formed in a semiconductor circuit, wafer, chip or die. The MOSFET can be an NMOS or PMOS transistor. In some embodiments, semiconductor structure 100 can be utilized in a power MOSFET.

Referring to the exemplary embodiment shown in FIG. 1, semiconductor structure 100 includes a first gate 102, a second gate 104 disposed on a semiconductor layer 140 of the semiconductor structure 100 and extending parallel to the y-axis in a coordinate space 101, and a source region 106 disposed between the first gate 102 and the second gate 104. In exemplary embodiments, the source region 106 is disposed in the semiconductor structure 100. A plurality (e.g., multiple, although only three are shown) of body contacts 108, 110, 112 are formed in the source region 106 between the sides of the first gate 102 and the second gate 104. As mentioned above, while the body contacts 108, 110, 112 are shown to be centered between the gates 102, 104, in some embodiments, they are not necessarily centered between the gates 102, 104. In this exemplary embodiment, each body contact 108, 110, 112 is "canted"; that is, each body contact 108, 110, 112 has a side oriented with an angular deviation $\theta$ 114 from a side 116 of a gate 102, 104. In an exemplary embodiment, the angular deviation is 45 degrees. As such, in the perspective shown, each body contact 108, 110, 112 appears to be diamond-shaped at a working surface 142 of the semiconductor layer 140. The working surface 142 is parallel to the xy-plane of the coordinate system 101. Moreover, due to the "canted" body contacts 108, 110, 112, a portion of each source region, adjacent to the gate, has a width extending parallel to the y-axis that is greater than the width of the source region parallel to the y-axis at a distance on an x-axis in the coordinate space 101 from the gate 102, 104.

In some embodiments, for example, semiconductor structure 100 can be included in an NMOS transistor with source region 106 including a suitable material having an n-type conductivity, and body contacts 108, 110, 112 including a suitable doped material having a p-type conductivity. In other embodiments, for example, semiconductor structure 100 can be included in a PMOS transistor with source region 106 including a suitable material having a p-type conductivity, and body contacts 108, 110, 112 including a suitable doped material having an n-type conductivity. In exemplary embodiments, the gates 102, 104 are polysilicon; however, this is only an example and not meant to be limiting.

Figure 2:
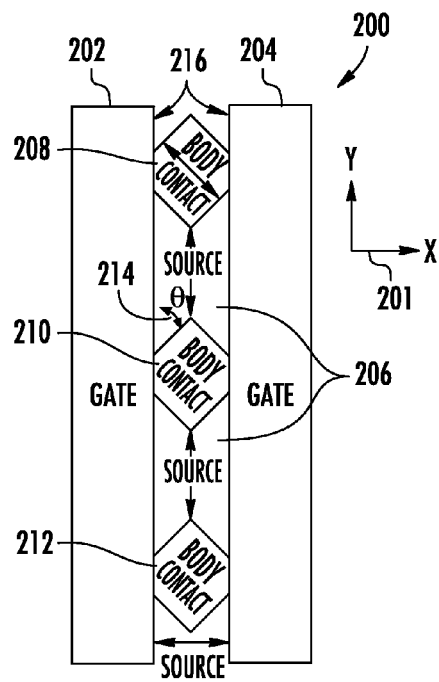
FIGS. 2-11 are diagrams of top-down views of exemplary embodiments of improved body contact layouts for enhanced performance of semiconductor structures.

FIG. 2 depicts a top-down view of a second semiconductor structure 200 for enhanced performance, in accordance with a second exemplary embodiment of the present disclosure. For example, in one embodiment, semiconductor structure 200 can be included in a MOSFET formed in a semiconductor circuit, wafer, chip or die. The MOSFET can be an NMOS or PMOS transistor. In some embodiments, semiconductor structure 200 can be utilized in a power MOSFET.

Referring to the exemplary embodiment shown in FIG. 2, semiconductor structure 200 includes a first gate 202, a second gate 204 disposed on a semiconductor layer of the semiconductor structure 200 and extending parallel to the y-axis in a coordinate space 201, and a source region 206 disposed between the first gate 202 and the second gate 204. In exemplary embodiments, the source region 206 is disposed in the semiconductor structure 200. A plurality (e.g., multiple, although only three are shown) of body contacts 208, 210, 212 are formed in the source region 206 between the sides of the first gate 202 and the second gate 204. As mentioned above, while the body contacts 208, 210, 212 are shown to be centered between the gates 202, 204, in some embodiments, they are not necessarily centered between the gates 202, 204. In this exemplary embodiment, each body contact 208, 210, 212 is "canted"; that is, each body contact 208, 210, 212 has a side oriented with an angular deviation $\theta$ 214 from a side 216 of a gate 202, 204. In an exemplary embodiment, the angular deviation is 45 degrees. As such, in the perspective shown, each body contact 208, 210, 212 appears to be diamond-shaped at a working surface of the semiconductor layer. The working surface is parallel to the xy-plane of the coordinate system 201. Moreover, due to the "canted" body contacts 208, 210, 212, a portion of each source region, adjacent to the gate, has a width extending parallel to the y-axis that is greater than the width of the source region parallel to the y-axis at a distance on an x-axis in the coordinate space 201 from the gate 202, 204.

In some embodiments, for example, semiconductor structure 200 can be included in an NMOS transistor with source region 206 including a suitable material having an n-type conductivity, and body contacts 208, 210, 212 including a suitable doped material having a p-type conductivity. In other embodiments, for example, semiconductor structure 200 can be included in a PMOS transistor with source region 206 including a suitable material having a p-type conductivity, and body contacts 208, 210, 212 including a suitable doped material having an n-type conductivity. In exemplary embodiments, the gates 202, 204 are polysilicon; however, this is only an example and not meant to be limiting.

Notably, the pitch or distance between first gate 202 and the second gate 204 in semiconductor structure 200 is virtually identical to the pitch between gates in conventional semiconductor structures configured as MOSFETs. However, utilizing the "canted" body contacts 208, 210, 212 instead of conventional body contacts in the semiconductor structure 200 reduces the amount of the source region adjacent to the gates displaced by the body contacts. In fact, for example, there is approximately a 17% loss of source area (linear dimension) utilizing such "canted" body contacts in a semiconductor structure 200, as opposed to a 50% loss of source area in a similar semiconductor structure utilizing conventional body contacts.

Figure 3:
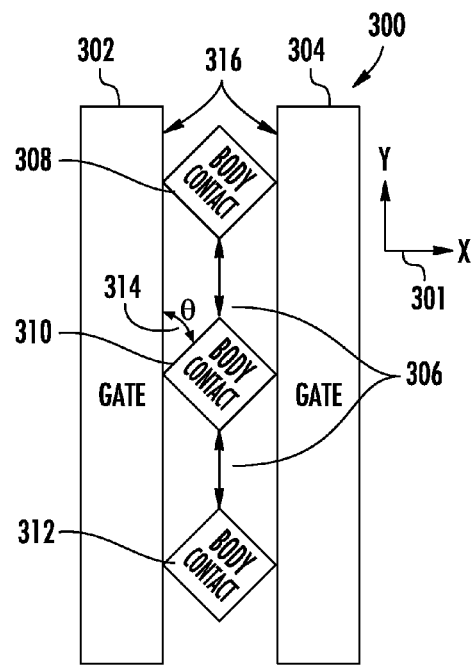

FIG. 3 depicts a top-down view of a third semiconductor structure 300 for enhanced performance, in accordance with a third exemplary embodiment of the present disclosure. For example, in the embodiment shown, semiconductor structure 300 can be included in a MOSFET formed in a semiconductor circuit, wafer, chip or die. The MOSFET can be, for example, an NMOS or PMOS transistor. In some embodiments, semiconductor structure 300 can be utilized as a power MOSFET.

Referring to the exemplary embodiment shown in FIG. 3, semiconductor structure 300 includes a first gate 302, a second gate 304 disposed on a semiconductor layer of the semiconductor structure 300 and extending parallel to the y-axis in a coordinate space 301, and a source region 306 disposed between the first gate 302 and the second gate 304. In exemplary embodiments, the source region 306 is disposed in the semiconductor structure 300. A plurality (e.g., multiple, although only three are shown) of body contacts 308, 310, 312 are formed in the source region 306 between the first gate 302 and the second gate 304. While the body contacts 308, 310, 312 are shown to be centered between the gates 302, 304, in some embodiments, they are not necessarily centered between the gates 302, 304. In this exemplary embodiment, each body contact 308, 310, 312 is "canted"; that is, each body contact 308, 310, 312 has a side oriented with an angular deviation θ 314 from a side 316 of a gate 302, 304. In an exemplary embodiment, the angular deviation is 45 degrees. As such, in the perspective shown, each body contact 308, 310, 312 appears to be diamond-shaped at a working surface of the semiconductor layer. The working surface is parallel to the xy-plane of the coordinate system 301. Moreover, due to the "canted" body contacts 308, 310, 312, a portion of each source region, adjacent to the gate, has a width extending parallel to the y-axis that is greater than the width of the source region parallel to the y-axis at a distance on an x-axis in the coordinate space 301 from the gate 302, 304.

In some embodiments, for example, semiconductor structure 300 can be included in an NMOS transistor with source region 306 including a suitable material having an n-type conductivity, and body contacts 308, 310, 312 including a suitable doped material having a p-type conductivity. In other embodiments, for example, semiconductor structure 300 can be included in a PMOS transistor with source region 306 including a suitable material having a p-type conductivity, and body contacts 308, 310, 312 including a suitable doped material having an n-type conductivity. In exemplary embodiments, the gates 302, 304 are polysilicon; however, this is only an example and not meant to be limiting.

Notably, the primary difference between the layout of semiconductor structure 300 shown in FIG. 3 and semiconductor structure 200 shown in FIG. 2 is that the opening of the source region 302 in semiconductor 300 is increased over that of the source region 202 in semiconductor structure 200. As such, each of the "canted" body contacts 308, 310, 312 barely touches the first gate 302 or the second gate 304. Consequently, the effective loss of source region between each "canted" body contact 308, 310, 312 and the gate 302 or gate 304 is equal to zero, and the distance between the adjacent gates is 1.4 (square root of 2) units (where 1 unit equals the minimum lithography dimension allowed in a given technology), as opposed to 1+2*x for conventional body contacts. Notably, the value of "x" (i.e., the distance between a side of a conventional body contact and the side of a gate) is different for different semiconductor technologies and typically has to be optimized to ensure that no source width is lost. In any event, the use of such "canted" body contacts in MOSFETs is superior to the use of conventional body contacts in MOSFETs if the value of "x" is greater than 0.2 of a unit.

Figure 4:
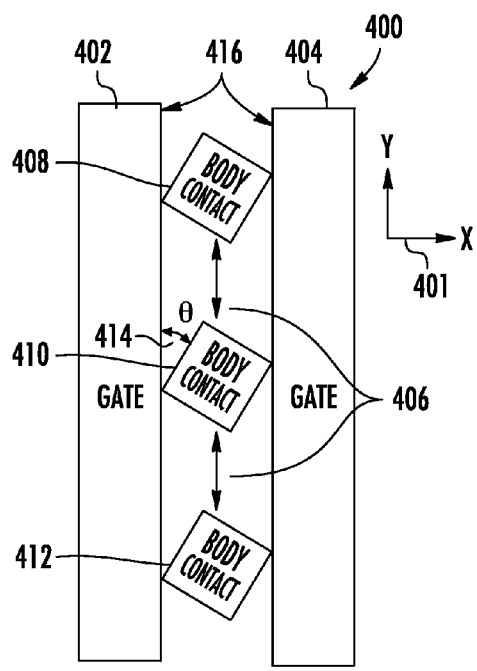
Figure 5:
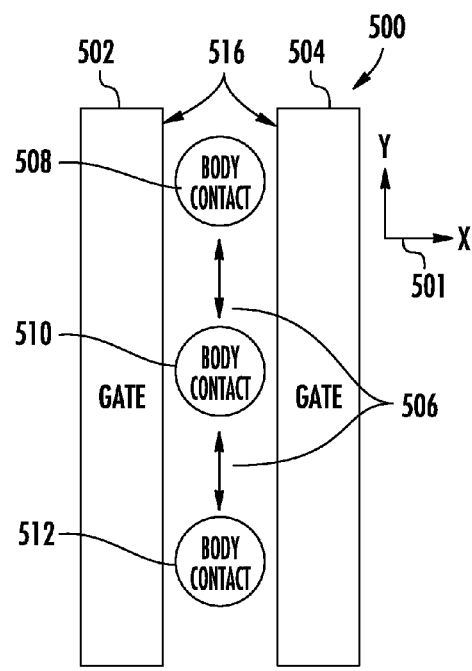

FIG. 4 depicts a top-down view of a fourth semiconductor structure 400 for enhanced performance, in accordance with a fourth exemplary embodiment of the present disclosure. For example, in the embodiment shown, semiconductor structure 400 can be included in a MOSFET formed in a semiconductor circuit, wafer, chip or die. The MOSFET can be, for example, an NMOS or PMOS transistor. In some embodiments, semiconductor structure 400 can be utilized as a power MOSFET.

Referring to the exemplary embodiment shown in FIG. 4, semiconductor structure 400 includes a first gate 402, a second gate 404 disposed on a semiconductor layer of the semiconductor structure 400 and extending parallel to the y-axis in a coordinate space 401, and a source region 406 disposed between the first gate 402 and the second gate 404. In exemplary embodiments, the source region 406 is disposed in the semiconductor structure 400. A plurality (e.g., multiple, although only three are shown) of body contacts 408, 410, 412 are formed in the source region 406 between the first gate 402 and the second gate 404. While the body contacts 408, 410, 412 are shown to be centered between the gates 402, 404, in some embodiments, they are not necessarily centered between the gates 402, 404. In this exemplary embodiment, each body contact 408, 410, 412 is "canted"; that is, each body contact 408, 410, 412 has a side oriented with an angular deviation θ 414 from a side 416 of a gate 402, 404. In an exemplary embodiment, the angular deviation is between approximately 5 degrees and 85. As such, in the perspective shown, each body contact 408, 410, 412 appears generally to be polygon-shaped at a working surface of the semiconductor structure 400 with one side drawn at an angle, θ 414, which is not equal to 0 or 90 degrees. However, in some embodiments, one or more of the body contacts 408, 410, 412 can be shaped as a rectangle, parallelogram, trapezoid, pentagon, hexagon, or octagon and the like at a working surface of the semiconductor layer. The working surface is parallel to the xy-plane of the coordinate system 401. Moreover, due to the "canted" body contacts 408, 410, 412, a portion of each source region, adjacent to the gate, has a width extending parallel to the y-axis that is greater than the width of the source region parallel to the y-axis at a distance on an x-axis in the coordinate space 401 from the gate 402, 404.

In some embodiments, for example, semiconductor structure 400 can be included in an NMOS transistor with source region 406 including a suitable material having an n-type conductivity, and body contacts 408, 410, 412 including a suitable doped material having a p-type conductivity. In other embodiments, for example, semiconductor structure 400 can be included in a PMOS transistor with source region 406 including a suitable material having a p-type conductivity, and body contacts 408, 410, 412 including a suitable doped material having an n-type conductivity. In exemplary embodiments, the gates 402, 404 are polysilicon; however, this is only an example and not meant to be limiting.

FIG. 5 depicts a top-down view of a fifth semiconductor structure 500 for enhanced performance, in accordance with a fifth exemplary embodiment of the present disclosure. For example, in the embodiment shown, semiconductor structure 500 can be included in a MOSFET formed in a semiconductor circuit, wafer, chip or die. The MOSFET can be, for example, an NMOS or PMOS transistor. In some embodiments, semiconductor structure 500 can be utilized as a power MOSFET.

Referring to the exemplary embodiment shown in FIG. 5, semiconductor structure 500 includes a first gate 502, a second gate 504 disposed on a semiconductor layer of the semiconductor structure 500 and extending parallel to the y-axis in a coordinate space 501, and a source region 506 disposed between the first gate 502 and the second gate 504. In exemplary embodiments, the source region 506 is disposed in the semiconductor structure 500. A plurality (e.g., multiple, although only three are shown) of body contacts 508, 510, 512 are formed in the source region 506 between the first gate 502 and the second gate 504. While the body contacts 508, 510, 512 are shown to be centered between the gates 502, 504, in some embodiments, they are not necessarily centered between the gates 502, 504. In this exemplary embodiment, each body contact 508, 510, 512 is substantially circle-shaped at a working surface of the semiconductor layer. The working surface is parallel to the xy-plane of the coordinate system 501. For example, each body contact 508, 510, 512 may have been drawn originally as a rectangle, but is eventually formed into a circle or a polygon similar to a circle (e.g., circle with sides) during the fabrication process. Moreover, due to the circle body contacts 508, 510, 512, a portion of each source region, adjacent to the gate, has a width extending parallel to the y-axis that is greater than the width of the source region parallel to the y-axis at a distance on an x-axis in the coordinate space 501 from the gate 502, 504.

In some embodiments, for example, semiconductor structure 500 can be included in an NMOS transistor with source region 506 including a suitable material having an n-type conductivity, and body contacts 508, 510, 512 including a suitable doped material having a p-type conductivity. In other embodiments, for example, semiconductor structure 500 can be included in a PMOS transistor with source region 506 including a suitable material having a p-type conductivity, and body contacts 508, 510, 512 including a suitable doped material having an n-type conductivity. In exemplary embodiments, the gates 502, 504 are polysilicon; however, this is only an example and not meant to be limiting.

Figure 6:
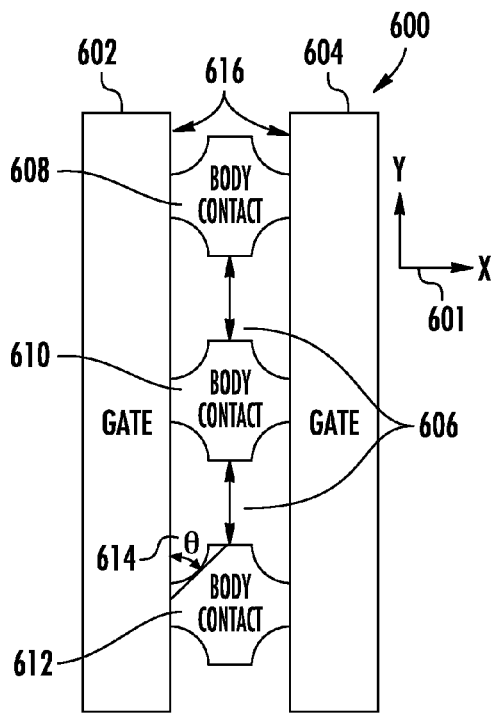

FIG. 6 depicts a top-down view of a sixth semiconductor structure 600 for enhanced performance, in accordance with a sixth exemplary embodiment of the present disclosure. For example, in the embodiment shown, semiconductor structure 600 can be included in a MOSFET formed in a semiconductor circuit, wafer, chip or die. The MOSFET can be, for example, an NMOS or PMOS transistor. In some embodiments, semiconductor structure 600 can be utilized as a power MOSFET.

Referring to the exemplary embodiment shown in FIG. 6, semiconductor structure 600 includes a first gate 602, a second gate 604 disposed on a semiconductor layer of the semiconductor structure 600 and extending parallel to the y-axis in a coordinate space 601, and a source region 606 disposed between the first gate 602 and the second gate 604. In exemplary embodiments, the source region 606 is disposed in the semiconductor structure 600. A plurality (e.g., multiple, although only three are shown) of body contacts 608, 610, 612 are formed in the source region 606 between the first gate 602 and the second gate 604. While the body contacts 608, 610, 612 are shown to be centered between the gates 602, 604, in some embodiments, they are not necessarily centered between the gates 602, 604. In this exemplary embodiment, the shape of each body contact 608, 610, 612 is a quadrilateral with modified, rounded or chamfered corners at a working surface of the semiconductor layer. The working surface is parallel to the xy-plane of the coordinate system 601. For example, a quarter circle of material can be removed from each corner of each body contact to form the body contacts 608, 610, 612 shown. In this exemplary embodiment, the slope of the vertex (e.g., θ 614) of each modified corner, with respect to the sides 616 of gates 602, 604 is between approximately 5 degrees and 85 degrees. Moreover, due to the slope of the vertex of each modified corner with respect to the sides 616 of gates 602, 604 being between approximately 5 degrees and 85 degrees, a portion of each source region, adjacent to the gate, has a width extending parallel to the y-axis that is greater than the width of the source region parallel to the y-axis at a distance on an x-axis in the coordinate space 601 from the gate 602, 604.

In some embodiments, for example, semiconductor structure 600 can be included in an NMOS transistor with source region 606 including a suitable material having an n-type conductivity, and body contacts 608, 610, 612 including a suitable doped material having a p-type conductivity. In other embodiments, for example, semiconductor structure 600 can be included in a PMOS transistor with source region 606 including a suitable material having a p-type conductivity, and body contacts 608, 610, 612 including a suitable doped material having an n-type conductivity. In exemplary embodiments, the gates 602, 604 are polysilicon; however, this is only an example and not meant to be limiting.

Figure 7:
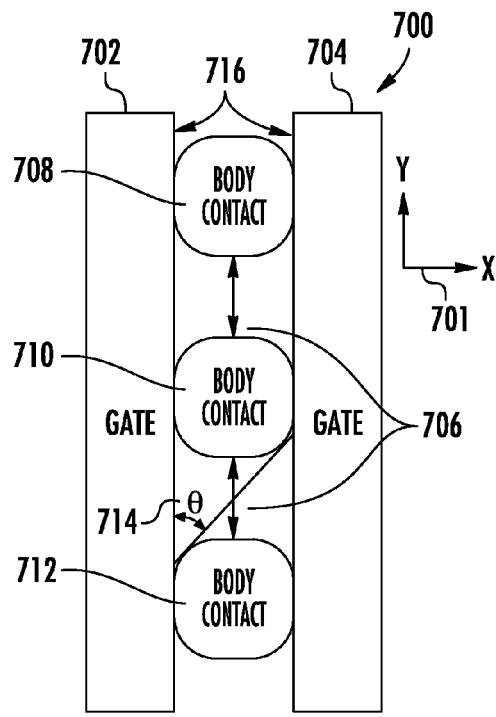

FIG. 7 depicts a top-down view of a seventh semiconductor structure 700 for enhanced performance, in accordance with a sixth exemplary embodiment of the present disclosure. For example, in the embodiment shown, semiconductor structure 700 can be included in a MOSFET formed in a semiconductor circuit, wafer, chip or die. The MOSFET can be, for example, an NMOS or PMOS transistor. In some embodiments, semiconductor structure 700 can be utilized as a power MOSFET.

Referring to the exemplary embodiment shown in FIG. 7, semiconductor structure 700 includes a first gate 702, a second gate 704 disposed on a semiconductor layer of the semiconductor structure 700 and extending parallel to the y-axis in a coordinate space 701, and a source region 706 disposed between the first gate 702 and the second gate 704. In exemplary embodiments, the source region 706 is disposed in the semiconductor structure 700. A plurality (e.g., multiple, although only three are shown) of body contacts 708, 710, 712 are formed in the source region 706 between the first gate 702 and the second gate 704. While the body contacts 708, 710, 712 are shown to be centered between the gates 702, 704, in some embodiments, they are not necessarily centered between the gates 702, 704. In this exemplary embodiment, the shape of each body contact 708, 710, 712 is a quadrilateral with modified, rounded or chamfered corners. For example, each corner of each body contact can be modified by smoothing the corner into a circular arc to form the body contacts 708, 710, 712 shown at a working surface of the semiconductor layer. The working surface is parallel to the xy-plane of the coordinate system 701. In this exemplary embodiment, the slope of the vertex (e.g., θ 714) of each modified corner, with respect to the sides 716 of gates 702, 704 is between approximately 5 degrees and 85 degrees. Moreover, due to the slope of the vertex of each modified corner with respect to the sides 716 of gates 702, 704 being between approximately 5 degrees and 85 degrees, a portion of each source region, adjacent to the gate, has a width extending parallel to the y-axis that is greater than the width of the source region parallel to the y-axis at a distance on an x-axis in the coordinate space 701 from the gate 702, 704.

In some embodiments, for example, semiconductor structure 700 can be included in an NMOS transistor with source region 706 including a suitable material having an n-type conductivity, and body contacts 708, 710, 712 including a suitable doped material having a p-type conductivity. In other embodiments, for example, semiconductor structure 700 can be included in a PMOS transistor with source region 706 including a suitable material having a p-type conductivity, and body contact 708, 710, 712 including a suitable doped material having an n-type conductivity. In exemplary embodiments, the gates 702, 704 are polysilicon; however, this is only an example and not meant to be limiting.

Figure 8:
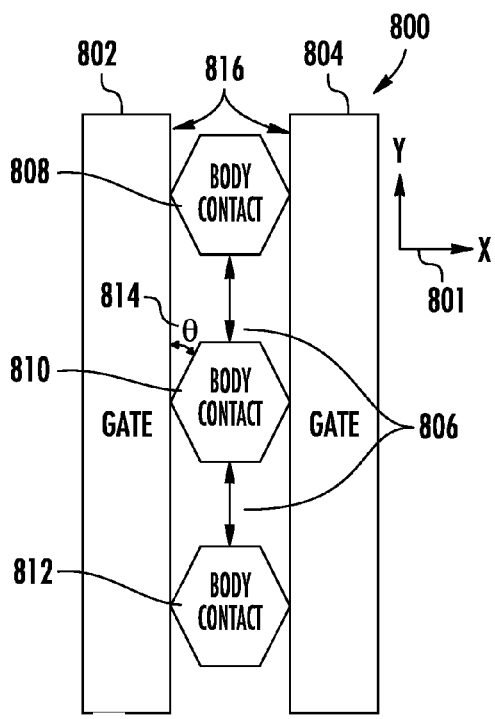

FIG. 8 depicts a top-down view of a eighth semiconductor structure 800 for enhanced performance, in accordance with an eighth exemplary embodiment of the present disclosure. For example, in the embodiment shown, semiconductor structure 800 can be included in a MOSFET formed in a semiconductor circuit, wafer, chip or die. The MOSFET can be, for example, an NMOS or PMOS transistor. In some embodiments, semiconductor structure 800 can be utilized as a power MOSFET.

Referring to the exemplary embodiment shown in FIG. 8, semiconductor structure 800 includes a first gate 802, a second gate 804 disposed on a semiconductor layer of the semiconductor structure 800 and extending parallel to the y-axis in a coordinate space 801, and a source region 806 disposed between the first gate 802 and the second gate 804. In exemplary embodiments, the source region 806 is disposed in the semiconductor structure 800. A plurality (e.g., multiple, although only three are shown) of body contacts 808, 810, 812 are formed in the source region 806 between the first gate 802 and the second gate 804. While the body contacts 808, 810, 812 are shown to be centered between the gates 802, 804, in some embodiments, they are not necessarily centered between the gates 802, 804. In this exemplary embodiment, the shape of each body contact 808, 810, 812 is a hexagon at a working surface of the semiconductor layer. The working surface is parallel to the xy-plane of the coordinate system 801. In this exemplary embodiment, the slope of the vertex (e.g., θ 814) of each vertically-oriented side of each body contact 808, 810, 812 with respect to the sides 816 of gates 802, 804 can be any angle between approximately 5 degrees and 85 degrees. Moreover, due to the slope of the vertex of each vertically-oriented side of each body contact 808, 810, 812 with respect to the sides 816 of gates 802, 804 being between approximately 5 degrees and 85 degrees, a portion of each source region, adjacent to the gate, has a width extending parallel to the y-axis that is greater than the width of the source region parallel to the y-axis at a distance on an x-axis in the coordinate space 801 from the gate 802, 804.

In some embodiments, for example, semiconductor structure 800 can be included in an NMOS transistor with source region 806 including a suitable material having an n-type conductivity, and body contacts 808, 810, 812 including a suitable doped material having a p-type conductivity. In other embodiments, for example, semiconductor structure 800 can be included in a PMOS transistor with source region 806 including a suitable material having a p-type conductivity, and body contacts 808, 810, 812 including a suitable doped material having an n-type conductivity. In exemplary embodiments, the gates 802, 804 are polysilicon; however, this is only an example and not meant to be limiting.

Figure 9:
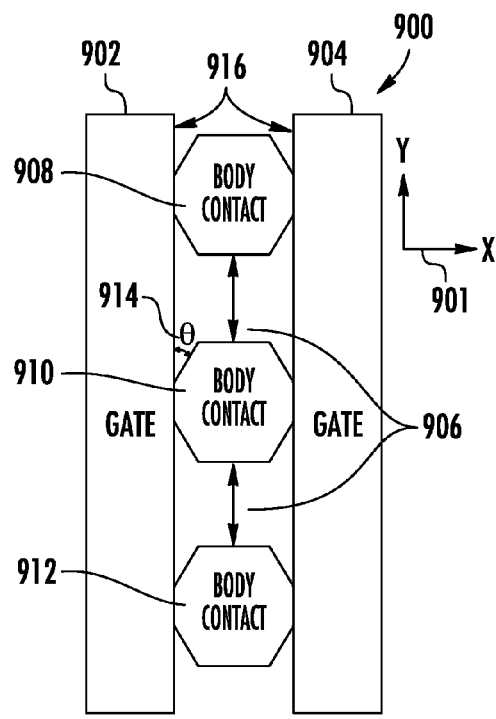

FIG. 9 depicts a top-down view of a ninth semiconductor structure 900 for enhanced performance, in accordance with an ninth exemplary embodiment of the present disclosure. For example, in the embodiment shown, semiconductor structure 900 can be included in a MOSFET formed in a semiconductor circuit, wafer, chip or die. The MOSFET can be, for example, an NMOS or PMOS transistor. In some embodiments, semiconductor structure 900 can be utilized as a power MOSFET.

Referring to the exemplary embodiment shown in FIG. 9, semiconductor structure 900 includes a first gate 902, a second gate 904 disposed on a semiconductor layer of the semiconductor structure 900 and extending parallel to the y-axis in a coordinate space 901, and a source region 906 disposed between the first gate 902 and the second gate 904. In exemplary embodiments, the source region 906 is disposed in the semiconductor structure 900. A plurality (e.g., multiple, although only three are shown) of body contacts 908, 910, 912 are formed in the source region 906 between the first gate 902 and the second gate 904. While the body contacts 908, 910, 912 are shown to be centered between the gates 902, 904, in some embodiments, they are not necessarily centered between the gates 902, 904. In this exemplary embodiment, the shape of each body contact 908, 910, 912 is an octagon at a working surface of the semiconductor layer. The working surface is parallel to the xy-plane of the coordinate system 901. In this exemplary embodiment, the slope of the vertex (e.g., θ 914) of each vertically-oriented side of each body contact 908, 910, 912, with respect to the sides 916 of gates 902, 904 can be any angle between approximately 5 degrees and 85 degrees. Moreover, due to the slope of the vertex of each vertically-oriented side of each body contact 908, 910, 912 with respect to the sides 916 of gates 902, 904 being between approximately 5 degrees and 85 degrees, a portion of each source region, adjacent to the gate, has a width extending parallel to the y-axis that is greater than the width of the source region parallel to the y-axis at a distance on an x-axis in the coordinate space 901 from the gate 902, 904.

In some embodiments, for example, semiconductor structure 900 can be included in an NMOS transistor with source region 906 including a suitable material having an n-type conductivity, and body contacts 908, 910, 912 including a suitable doped material having a p-type conductivity. In other embodiments, for example, semiconductor structure 900 can be included in a PMOS transistor with source region 906 including a suitable material having a p-type conductivity, and body contacts 908, 910, 912 including a suitable doped material having an n-type conductivity. In exemplary embodiments, the gates 902, 904 are polysilicon; however, this is only an example and not meant to be limiting.

Figures 10, 11:
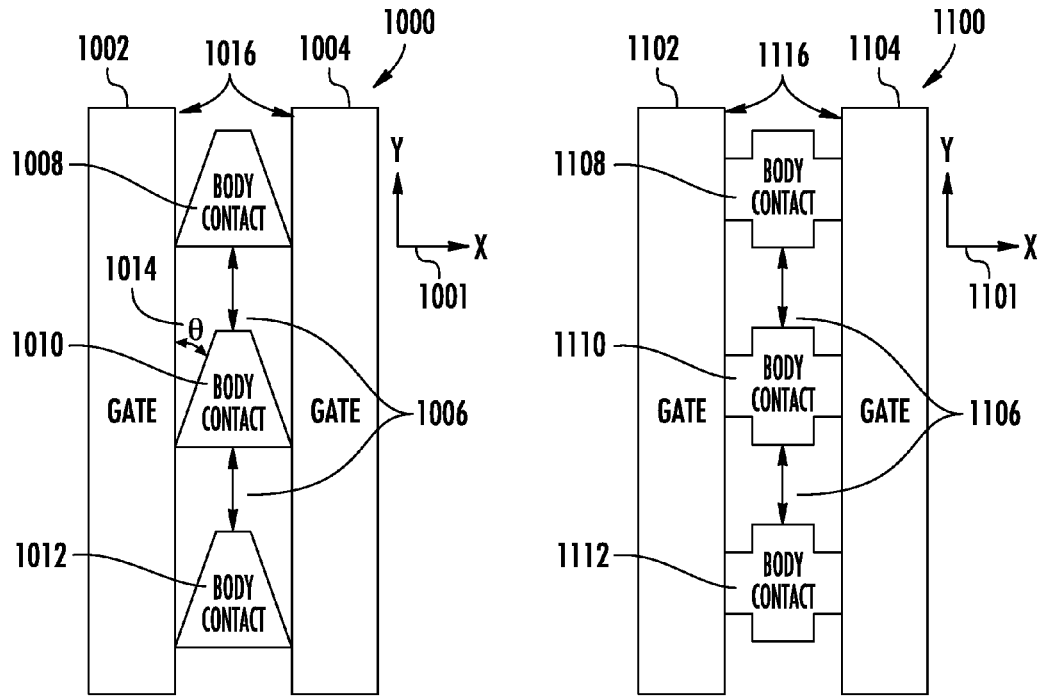

FIG. 10 depicts a top-down view of a tenth semiconductor structure 1000 for enhanced performance, in accordance with a tenth exemplary embodiment of the present disclosure. For example, in the embodiment shown, semiconductor structure 1000 can be included in a MOSFET formed in a semiconductor circuit, wafer, chip or die. The MOSFET can be, for example, an NMOS or PMOS transistor. In some embodiments, semiconductor structure 1000 can be utilized as a power MOSFET.

Referring to the exemplary embodiment shown in FIG. 10, semiconductor structure 1000 includes a first gate 1002, a second gate 1004 disposed on a semiconductor layer of the semiconductor structure 1000 and extending parallel to the y-axis in a coordinate space 1001, and a source region 1006 disposed between the first gate 1002 and the second gate 1004. In exemplary embodiments, the source region 1006 is disposed in the semiconductor structure 1000. A plurality (e.g., multiple, although only three are shown) of body contacts 1008, 1010, 1012 are formed in the source region 1006 between the first gate 1002 and the second gate 1004. While the body contacts 1008, 1010, 1012 are shown to be centered between the gates 1002, 1004, in some embodiments, they are not necessarily centered between the gates 1002, 1004. In this exemplary embodiment, the shape of each body contact 1008, 1010, 1012 is a quadrilateral at a working surface of the semiconductor layer. The working surface is parallel to the xy-plane of the coordinate system 1001. In this exemplary embodiment, the slope of the vertex (e.g., θ 1014) of each vertically-oriented side of each body contact 1008, 1010, 1012, with respect to the sides 1016 of gates 1002, 1004 can be any angle between approximately 5 degrees and 85 degrees. Notably, in some embodiment, the opposite vertices of each body contact 1008, 1010, 1012 may not be parallel to each other. Moreover, due to the slope of the vertex of each vertically-oriented side of each body contact 1008, 1010, 1012 with respect to the sides 1016 of gates 1002, 1004 being between approximately 5 degrees and 85 degrees, a portion of each source region, adjacent to the gate, has a width extending parallel to the y-axis that is greater than the width of the source region parallel to the y-axis at a distance on an x-axis in the coordinate space 1001 from the gate 1002, 1004.

In some embodiments, for example, semiconductor structure 1000 can be included in an NMOS transistor with source region 1006 including a suitable material having an n-type conductivity, and body contacts 1008, 1010, 1012 including a suitable doped material having a p-type conductivity. In other embodiments, for example, semiconductor structure 1000 can be included in a PMOS transistor with source region 1006 including a suitable material having a p-type conductivity, and body contacts 1008, 1010, 1012 including a suitable doped material having an n-type conductivity. In exemplary embodiments, the gates 1002, 1004 are polysilicon; however, this is only an example and not meant to be limiting.

FIG. 11 depicts a top-down view of a eleventh semiconductor structure 1100 for enhanced performance, in accordance with an eleventh exemplary embodiment of the present disclosure. For example, in the embodiment shown, semiconductor structure 1100 can be included in a MOSFET formed in a semiconductor circuit, wafer, chip or die. The MOSFET can be, for example, an NMOS or PMOS transistor. In some embodiments, semiconductor structure 1100 can be utilized as a power MOSFET.

Referring to the exemplary embodiment shown in FIG. 11, semiconductor structure 1100 includes a first gate 1102, a second gate 1104 disposed on a semiconductor layer of the semiconductor structure 1100 and extending parallel to the y-axis in a coordinate space 1101, and a source region 1106 disposed between the first gate 1102 and the second gate 1104. In exemplary embodiments, the source region 1106 is disposed in the semiconductor structure 1100. A plurality (e.g., multiple, although only three are shown) of body contacts 1108, 1110, 1112 are formed in the source region 1106 between the first gate 1102 and the second gate 1104. While the body contacts 1108, 1110, 1112 are shown to be centered between the gates 1102, 1104, in some embodiments, they are not necessarily centered between the gates 1102, 1104. In this exemplary embodiment, the shape of each body contact 1108, 1110, 1112 is essentially a star (or cross) at a working surface of the semiconductor layer. The working surface is parallel to the xy-plane of the coordinate system 1101. Moreover, due to the shape of each body contact 1108, 1110, 1112 being essentially a star (or cross), a portion of each source region, adjacent to the gate, has a width extending parallel to the y-axis that is greater than the width of the source region parallel to the y-axis at a distance on an x-axis in the coordinate space 1101 from the gate 1102, 1104.

In some embodiments, for example, semiconductor structure 1100 can be included in an NMOS transistor with source region 1106 including a suitable material having an n-type conductivity, and body contacts 1108, 1110, 1112 including a suitable doped material having a p-type conductivity. In other embodiments, for example, semiconductor structure 1100 can be included in a PMOS transistor with source region 1106 including a suitable material having a p-type conductivity, and body contacts 1108, 1110, 1112 including a suitable doped material having an n-type conductivity. In exemplary embodiments, the gates 1102, 1104 are polysilicon; however, this is only an example and not meant to be limiting.

Figure 12:
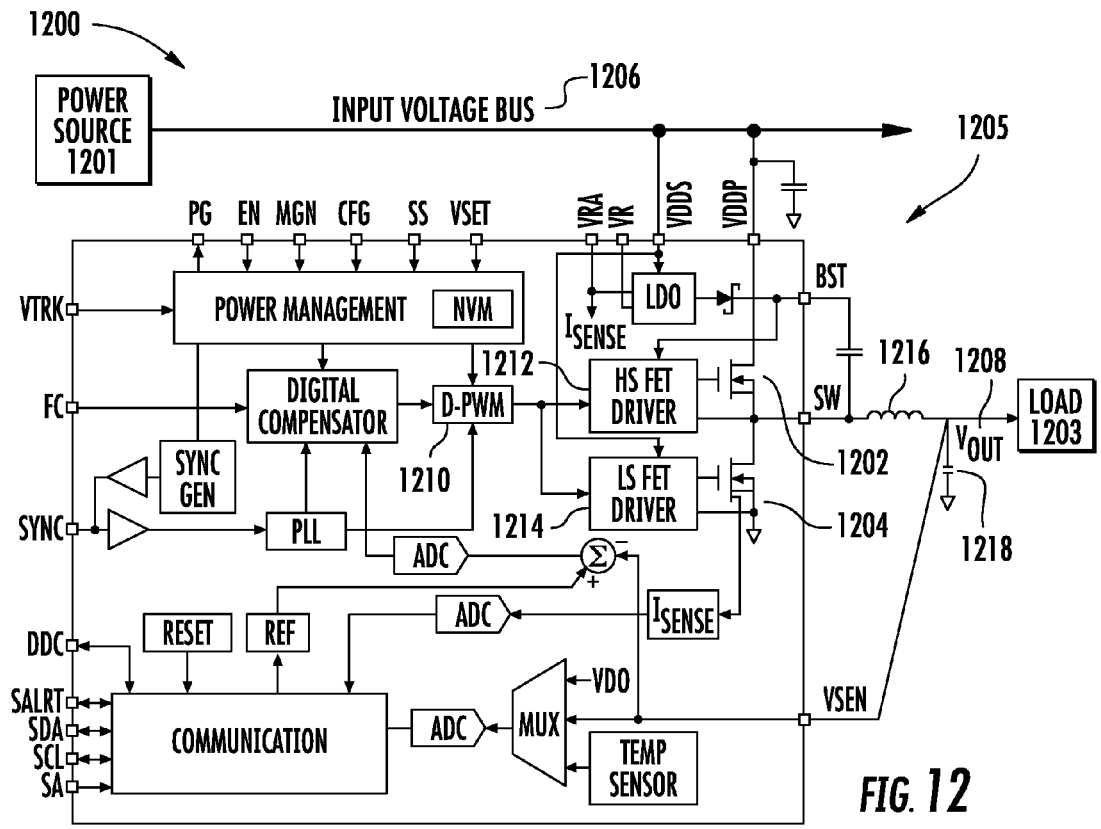
FIG. 12 is a block diagram of an exemplary semiconductor circuit that can be used to implement one or more of the improved body contact layouts of the present disclosure.

FIG. 12 is a block diagram of an exemplary system 1200 that includes a voltage regulator 1205, which can be utilized to implement one or more exemplary embodiments of the present disclosure. For example, system 1200 can be utilized to implement one or more semiconductor structures with "canted" and/or "modified" body contacts such as semiconductor structures 100 through 1100 shown in FIGS. 1 through 11.

Referring to the exemplary embodiment shown in FIG. 12, voltage regulator 1205 receives an input voltage 1206 from a power source (e.g., line power, battery power) 1201 and transforms the input voltage 1206 into an output voltage 1208 for a load 1203 to receive. The load 1208 can include, but is not limited to, one or more processors (e.g., a central processing unit (CPU), a microcontroller, microprocessor, a field programmable gate array (FPGA), an application specific integrated circuit (ASIC), etc.), a display device (e.g., a light-emitting diode (LED) display, a liquid crystal display (LCD), a cathode ray tube (CRT) display, etc.), a memory device (e.g., a conventional hard disk, a volatile or non-volatile media such as a solid state hard drive, random access memory (RAM) including, but not limited to, synchronous dynamic random access memory (SDRAM), double data rate (DDR) RAM, RAMBUS dynamic RAM (RDRAM), static RAM (SRAM), etc.), electrically erasable programmable ROM (EEPROM), and flash memory, etc.), other peripheral devices, an internal device component, or other components.

The semiconductor circuit 1200 transforms the input voltage 1206 to the output voltage 1208 by using a pulse-width modulation (PWM) controller 1210 that sends control signals to a high side FET driver 1212 and a low side FET driver 1214. The high side FET driver 1212 and the low side FET driver 1214 switch on and off a high side FET 1202 and a low side FET 1204. As a result, a square wave is produced from the input voltage 1206. The square wave can then be smoothed using an LC circuit comprising an inductor 1216 and a capacitor 1218 to produce the desired output voltage 1208.

Each transistor 1202, 1204 included in the semiconductor circuit 1200 is a MOSFET including a plurality of "canted" body contacts as described in FIGS. 1-11 above. Moreover, in exemplary embodiments, the transistors 1202, 1204 can be formed on the same die as the PWM controller 1210 and drivers 1212, 1214. In other embodiments, the transistors 1202, 1204 are not formed on the same die as the PWM controller 1210 and drivers 1212, 1214. As such, the operating performance of each transistor 1202, 1204 (and semiconductor circuit 1200) is substantially higher than that of such a semiconductor circuit utilizing conventional body contacts.

Figure 13:
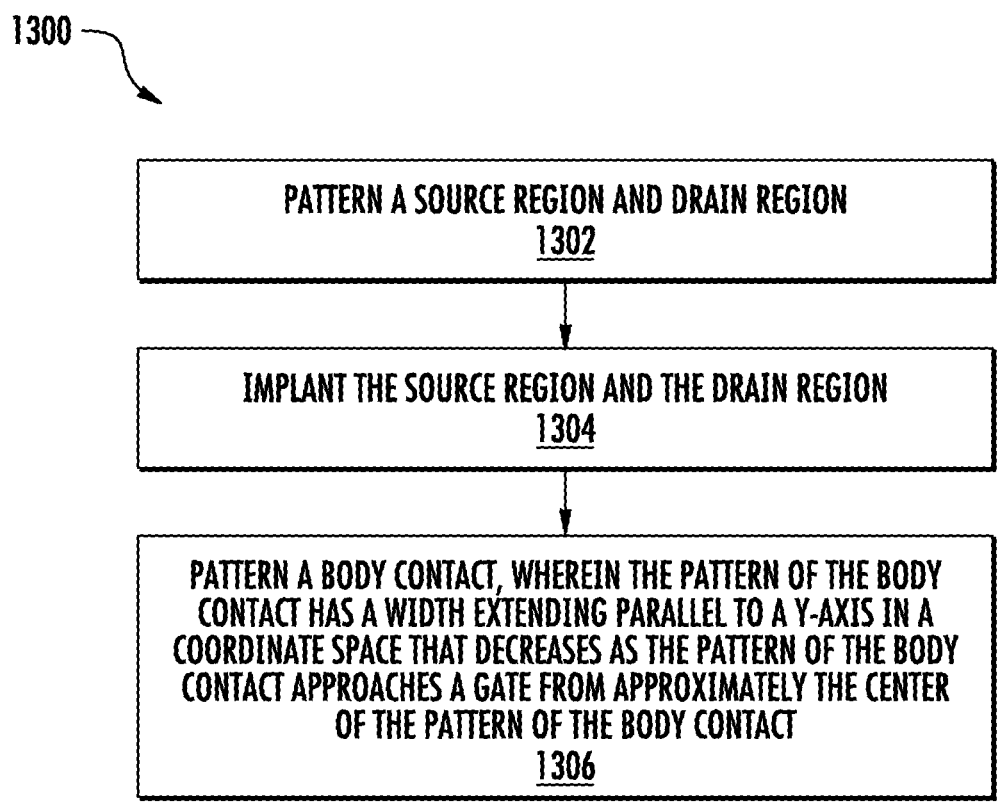
FIG. 13 is a flow diagram of an exemplary method for forming body contacts.

FIG. 13 is a flow diagram of an exemplary method 1300 for forming body contacts. The method 1300 comprises patterning a source region and a drain region on a semiconductor substrate (block 1302) and implanting the source region and the drain region (block 1304). The source and drain regions can be patterned and implanted using conventional methods. In some exemplary embodiments, the source and drain regions can be implanted using a P-type dopant. In other exemplary embodiments, the source and drain regions can be implanted using an N-type dopant.

The method 1300 further comprises patterning a body contact on the semiconductor substrate, wherein the pattern of the body contact has a width extending parallel to a y-axis in a coordinate space that decreases as the pattern of the body contact approaches a gate of the semiconductor structure from approximately the center of the pattern of the body contact (block 1306). In some exemplary embodiments, the pattern of the body contact has sides that form the shape of a polygon or modified polygon at a working surface of the semiconductor substrate. In some embodiments, the polygon and the modified polygon can be any of the polygons and modified polygons discussed above in FIGS. 1-11. For example, the modified polygon can be a polygon that has at least one modified corner, side or both, including being a circle. Moreover, the polygon can be one of the following: a square, a rectangle, a parallelogram, a trapezoid, a pentagon, a hexagon, an octagon, a star or a quadrilateral. In some embodiments, method 1300 can further comprise implanting the body region using conventional techniques. In some exemplary embodiments, the body region can be implanted with an N-type dopant. In some other exemplary embodiments, the body region can be implanted with a P-type dopant.

Example Embodiments

Example 1 includes a semiconductor structure, comprising: a plurality of gates disposed on a semiconductor layer, each gate extending parallel to a y-axis in a coordinate space; a source region disposed between two of the plurality of gates; a plurality of body contacts disposed in each source region; and wherein a portion of each source region, adjacent to the gate, has a width extending parallel to the y-axis that is greater than the width of the source region parallel to the y-axis at a distance on an x-axis from the gate.

Example 2 includes the semiconductor structure of Example 1, wherein each body contact of the plurality of body contacts has sides that form the shape of a polygon or a modified polygon at a working surface of the semiconductor layer.

Example 3 includes the semiconductor structure of Example 2, wherein the polygon or modified polygon has a side that is canted from a side of a gate of the plurality of gates.

Example 4 includes the semiconductor structure of any of Examples 2-3, wherein the polygon is one of the following: a square, a rectangle, a parallelogram, a trapezoid, a pentagon, a hexagon, an octagon, a star or a quadrilateral.

Example 5 includes the semiconductor structure of any of Examples 2-4, wherein the modified polygon is a polygon that has at least one modified corner, side, or both.

Example 6 includes the semiconductor structure of any of Examples 2-5, wherein the modified polygon is substantially a circle.

Example 7 includes the semiconductor structure of any of Examples 3-6, wherein each body contact of the plurality of body contacts has a side oriented with an angular deviation of between 5 degrees and 85 degrees from a side of a gate of the plurality of gates.

Example 8 includes the semiconductor structure of any of Examples 1-7, wherein the semiconductor structure is included in a transistor.

Example 9 includes a semiconductor circuit, comprising: a plurality of field-effect transistors (FETs); a first FET driver coupled to a first FET of the plurality of FETs; and a second FET driver coupled to a second FET of the plurality of FETs, wherein at least one FET of the plurality of FETs includes: a plurality of gates disposed on a semiconductor layer, each gate extending parallel to a y-axis in a coordinate space; a source region disposed between two of the plurality of gates; and a plurality of body contacts disposed in each source region, wherein each body contact has a width extending parallel to the y-axis that decreases as the body contact approaches a gate of the plurality of gates from approximately the center of the body contact.

Example 10 includes the semiconductor circuit of Example 9, wherein each body contact of the plurality of body contacts has sides that form the shape of a polygon or a modified polygon at a working surface of the semiconductor layer.

Example 11 includes the semiconductor circuit of Example 10, wherein the polygon or modified polygon has a side that is canted from a side of a gate of the plurality of gates.

Example 12 includes the semiconductor circuit of any of Examples 10-11, wherein the polygon is one of the following: a square, a rectangle, a parallelogram, a trapezoid, a pentagon, a hexagon, an octagon, a star or a quadrilateral.

Example 13 includes the semiconductor circuit of any of Examples 10-12, wherein the modified polygon is a polygon that has at least one modified corner, side, or both.

Example 14 includes the semiconductor circuit of any of Examples 10-13, wherein the modified polygon is substantially a circle.

Example 15 includes a method for forming body contacts, the method comprising: patterning a source region and a drain region on a semiconductor substrate; implanting the source region and the drain region; and patterning a body contact on the semiconductor substrate, wherein the pattern of the body contact has a width extending parallel to a y-axis in a coordinate space that decreases as the pattern of the body contact approaches a gate of the semiconductor structure from approximately the center of the pattern of the body contact.

Example 16 includes the method of Example 15, further comprising implanting the body contact.

Example 17 includes the method of any of Examples 15-16, wherein the pattern of the body contact has sides that form the shape of a polygon or modified polygon at a working surface of the semiconductor substrate.

Example 18 includes the method of any of Examples 15-17, wherein implanting the source region and the drain region comprises implanting a P-type dopant in the drain region and the source region and wherein implanting the body contact comprises implanting an N-type dopant in the body contact.

Example 19 includes the method of any of Examples 15-18, wherein implanting the source region and the drain region comprises implanting an N-type dopant in the drain region and the source region and wherein implanting the body contact comprises implanting a P-type dopant in the body contact.

Example 20 includes a system comprising: a power source configured to provide a voltage signal; a voltage regulator configured to regulate the voltage signal from the power source and produce an output voltage signal; a load coupled to the voltage regulator to receive the output voltage signal; and wherein at least one of the voltage regulator, the power source or the load includes a field-effect transistor (FET) used in producing the output voltage signal and wherein the FET includes: a plurality of gates disposed on a semiconductor layer, each gate extending parallel to a y-axis in a coordinate space; a source region disposed between two of the plurality of gates; a plurality of body contacts disposed in each source region; and wherein a portion of each source region, adjacent to the gate, has a width extending parallel to the y-axis that is greater than the width of the source region parallel to the y-axis at a distance on the x-axis from the gate.

Example 21 includes the system of Example 20, wherein each body contact of the plurality of body contacts has sides that form the shape of a polygon or a modified polygon at a working surface of the semiconductor layer.

Example 22 includes the system of Example 21, wherein the polygon or modified polygon has a side that is canted from a side of a gate of the plurality of gates.

Example 23 includes the system of any of Examples 21-22, wherein the polygon is one of the following: a square, a rectangle, a parallelogram, a trapezoid, a pentagon, a hexagon, an octagon, a star or a quadrilateral.

Example 24 includes the system of any of Examples 21-23, wherein the modified polygon is a polygon that has at least one modified corner, side, or both.

Example 25 includes the system of any of Examples 21-24, wherein each body contact of the plurality of body contacts includes at least one side with a normal that is oriented with an angular deviation of between substantially 5 degrees and 85 degrees from the normal of a side of a gate of the plurality of gates.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that the present disclosure be limited only by the claims and the equivalents thereof.

What is claimed is:

1. A semiconductor structure, comprising:
   a plurality of gates disposed on a semiconductor layer, each gate extending parallel to a y-axis in a coordinate space;
   a source region disposed between two of the plurality of gates;
   a plurality of body contacts disposed in each source region; and
   wherein a portion of each source region, adjacent to and in direct physical contact with the gate, has a width extending parallel to the y-axis that is greater than the width of the source region parallel to the y-axis at a distance on an x-axis from the gate, and each body contact of the plurality of body contacts has a side oriented with an angular deviation of between 5 degrees and 85 degrees from a side of a gate of the plurality of gates.

2. The semiconductor structure of claim 1, wherein each body contact of the plurality of body contacts has sides that form the shape of a polygon or a modified polygon at a working surface of the semiconductor layer.

3. The semiconductor structure of claim 2, wherein the polygon or modified polygon has a side that is canted from a side of a gate of the plurality of gates.

4. The semiconductor structure of claim 2, wherein the polygon is one of the following: a square, a rectangle, a parallelogram, a trapezoid, a pentagon, a hexagon, an octagon, a star or a quadrilateral.

5. The semiconductor structure of claim 2, wherein the modified polygon is a polygon that has at least one modified corner, side, or both.

6. The semiconductor structure of claim 2, wherein the modified polygon is substantially a circle.

7. The semiconductor structure of claim 1, wherein the semiconductor structure is included in a transistor.

* * * * *